(12) United States Patent
Nikfar (10) Patent No.: US 7,342,788 B2
(45) Date of Patent: Mar. 11, 2008

(54) RF POWER AMPLIFIER ASSEMBLY WITH HEAT PIPE ENHANCED PALLET

(75) Inventor: Nader Nikfar, Carlsbad, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 321 days.

(21) Appl. No.: 11/071,931

(22) Filed: Mar. 4, 2005

(65) Prior Publication Data
US 2005/0201061 A1    Sep. 15, 2005

Related U.S. Application Data

(60) Provisional application No. 60/552,470, filed on Mar. 12, 2004.

(51) Int. Cl.
*H05K 7/20* (2006.01)
*F28F 7/00* (2006.01)

(52) U.S. Cl. .................. 361/700; 165/104.33; 361/715

(58) Field of Classification Search ........... 165/104.33; 361/700
See application file for complete search history.

(56) References Cited

U.S. PATENT DOCUMENTS

| | | | | |
|---|---|---|---|---|
| 4,204,246 A | | 5/1980 | Arii et al. ................... 361/385 |
| 4,963,833 A | | 10/1990 | Mountz ....................... 330/65 |
| 6,084,772 A | | 7/2000 | Pell et al. .................... 361/699 |
| 6,102,110 A | * | 8/2000 | Julien et al. ........... 165/104.33 |
| 6,111,750 A | * | 8/2000 | Gates ......................... 361/700 |
| 6,163,073 A | | 12/2000 | Patel ........................... 257/712 |
| 6,178,088 B1 | * | 1/2001 | Gates ......................... 361/699 |
| 6,252,771 B1 | * | 6/2001 | Jordan ....................... 361/704 |
| 6,296,048 B1 | | 10/2001 | Sauer ........................ 165/80.3 |
| 6,424,528 B1 | * | 7/2002 | Chao .......................... 361/700 |
| 6,651,732 B2 | * | 11/2003 | Sagal ........................ 165/80.3 |

FOREIGN PATENT DOCUMENTS

JP                200126772 A    *    9/2001

* cited by examiner

*Primary Examiner*—Gregory D Thompson
(74) *Attorney, Agent, or Firm*—Myers Dawes Andras & Sherman LLP (57) ABSTRACT

An RF amplifier assembly employing a finned heat sink and a heat pipe enhanced aluminum pallet is disclosed. The hybrid heat pipe enhanced aluminum pallet reduces the spreading thermal conduction resistance associated with the conduction of localized energy from RF amplifier devices when compared to a copper pallet. The localized energy concentration of RF amplifier devices is spread along the length of the heat pipe increasing the overall efficiency of the heat sink coupled to the pallet and accommodating non-uniform heat loading. This reduces the junction temperature of the devices, which leads to higher mean time before failure and higher output levels. The pipes are formed and embedded into the pallet so as to pass under different areas of interest and extend to the under-utilized regions.

16 Claims, 8 Drawing Sheets

RF POWER AMPLIFIER ASSEMBLY WITH HEAT PIPE ENHANCED PALLET

RELATED APPLICATION INFORMATION

The present application is related to U.S. Provisional Patent Application, Ser. No. 60/552,470, filed on Mar. 12, 2004, which is incorporated herein by reference and to which priority is claimed pursuant to 35 USC 119 (e).

BACKGROUND OF THE INVENTION

1. Field of the Invention

The present invention relates generally to thermal management of RF power amplifiers of the type employed in wireless communications base stations. In particular the present invention relates to power amplifier assemblies and heat sink assemblies.

2. Description of the Prior Art and Related Background Information

Radio frequency (RF) power amplifiers of the type employed in cellular base stations typically comprise an RF amplifying circuit. The RF amplifying circuit generally is comprised of various devices including input and output impedance matching circuitry and a power amplifier device, typically one or more RF transistors. When the power amplifying device is operating, it generates a substantial amount of concentrated energy in form of heat. Proper thermal management is imperative to avoid degraded performance or permanent damages to devices. Any degradation in performance introduces distortion into the communication signal which is highly undesirable. Therefore, maintaining lower temperature for devices is a key issue in RF power amplifier design.

To address such thermal management issues, a main mechanical element of a packaged RF amplifier assembly is a finned metal heat sink. This heat sink is normally constructed from aluminum due to the reasonable economics of the material along with favorable thermal conductivity. The heat sink hosts a variety of electronic devices to provide mechanical support and more importantly serves as a cooling element for heat generating devices. In the presence of conventional convection methods, the thermal properties of aluminum and the general design of finned structures are satisfactory to meet the cooling requirements of the majority of devices. For RF devices used in power amplifiers, however, the heat generation density and large aspect ratio of sink to source creates notable resistance against conduction spreading. To improve this condition, the amplifier portion of the electronics is mounted on a copper heat spreader known as a pallet to reduce the conduction spreading resistance due to copper's superior thermal conductivity. Pallets are solid flat plates and they enhance the conduction path from the small source of heat generation to the main aluminum heat sink. Pallets also accommodate a modular design approach for building different designs of amplifiers. Copper pallets are rather costly and heavy, however. Also, depending on the configuration of the amplifier, it is not unlikely to have a few pallets in each amplifier which drives up the cost and weight. Thus, it is desirable to find alternatives to copper pallets.

An aluminum pallet would reduce the cost and weight as desired. However, due to aluminum's lower thermal conductivity than copper, there would exist a larger spreading resistance, which leads to higher device temperature that is not desirable for amplifier operation. This becomes a significant problem in high power RF amplifier applications. The high-density energy generation in each RF amplifier device utilized in power amplifiers for wireless telecommunications could reach as high as 100-150 W. Such high heat fluxes in small packages complicate the thermal management solutions. Therefore, for high power RF amplifiers substituting the copper pallet with an aluminum pallet leads to poor temperature distribution in the pallet which ultimately causes higher device temperature.

Accordingly, a need presently exists for a heat transfer system for RF power amplifiers capable of providing the necessary heat transfer from high power RF devices while avoiding the cost and weight of copper pallets.

BRIEF SUMMARY OF THE INVENTION

In a first aspect the present invention provides a power amplifier assembly comprising at least one electronics module including an RF power amplifier circuit, a pallet and a separate finned heat sink. The pallet is comprised of a support plate enhanced with at least one heat pipe having substantially higher thermal conductivity than the support plate embedded in the support plate. The electronics module is mounted on the pallet and the pallet is mounted on the finned heat sink.

In a preferred embodiment of the power amplifier assembly the support plate is a generally rectangular shaped solid metal plate and includes one or more hollow channels that transverse a horizontal surface of the plate, and the one or more heat pipes are mounted in the one or more channels. The heat pipe is a vacuumed hollow tube having a porous inner space containing a working fluid. The support plate is composed of a first material having a first thermal conductivity and the heat pipe is a superior conductor having an effective thermal conductivity several orders of magnitude higher than the first thermal conductivity. The support plate is preferably composed of aluminum and the heat pipe is comprised of a copper tube, a wicking structure or material, and a working fluid. The finned heat sink is preferably composed of aluminum. The heat pipe may have a generally cylindrical shape flattened on one surface portion to be coplanar with the surface of the support plate. Plural heat pipes having varying spacing along the length direction of the support plate may be provided in the support plate. The heat pipe may be curved along the length direction of the cylinder. The heat pipe may be inserted into a channel through a top surface of the pallet and the flattened portion of the heat pipe is coplanar with the top surface. Alternatively, the heat pipe may be inserted into a channel through a bottom surface of the pallet. In the latter case, the support plate may have an opening in the top surface extending down to the heat pipe. The RF power amplifier circuit may comprise plural amplifier device modules and separate heat pipes may be configured below each of the modules. The RF power amplifier circuit may comprise a main amplifier device module and a lower power auxiliary amplifier device module and plural heat pipes may be configured below the main module.

According to another aspect the present invention provides a modular heat pipe enhanced heat sink assembly comprising a finned heat sink having a generally flat upper surface, a generally rectangular support plate and at least one heat pipe mounted within the support plate. The heat transfer support plate is mounted onto the flat surface of the finned heat sink.

In a preferred embodiment of the modular heat pipe enhanced heat sink assembly the heat pipe's interior wall is lined with a porous material and filled with a working fluid.

The support plate preferably comprises at least one channel that transverses through the plate to a horizontal surface of the plate wherein the channel receives the heat pipe and wherein the heat pipe lies flush with the horizontal surface of the pallet. The support plate preferably comprises a first material having a first thermal conductivity and the heat pipe is a superior conductor having an effective thermal conductivity several orders of magnitude higher than the first thermal conductivity. The finned heat sink is preferably composed of aluminum, the support plate is preferably composed of aluminum and the heat pipe is preferably comprised of a copper tube, a wicking structure or material, and a working fluid. A plurality of heat pipes may be configured in the support plate. The heat pipes may be angled relative to each other having a spacing, which varies along their length direction.

Further features and advantages of the present invention are set out in the following detailed description.

DETAILED DESCRIPTION OF THE PREFERRED EMBODIMENTS

A first embodiment of the RF power amplifier assembly and heat transfer system of the present invention is shown in FIGS. 1-5. The power amplifier assembly 100 includes circuit boards 11, 12 incorporating heat-generating elements, such as RF transistors 14 that form potential hot spots, and a heat sink assembly 110. The heat sink assembly 110 incorporates a pallet 10 and a separate finned heat sink structure 16 for heat dissipation. The finned structure 16 includes a flat surface for receiving the pallet(s) 10 and fins 18 that extend vertically downward from the flat surface 10. In a preferred embodiment, the finned structure 16 is composed of aluminum. In many applications having plural electronic modules, not all may generate high magnitude/high density heat to require pallets, and these (illustrated as circuit boards 11) may be mounted directly on the finned structures 16.

The improved heat transfer system of the present invention is particularly adapted for high power RF amplifiers. Shown best in FIG. 5, the sources of heat generation in these RF amplifier modules 14 are high power integrated circuit devices 46, such as Laterally Diffused Metal Oxide Silicon (LDMOS) integrated circuits, and their maximum junction temperature must remain below a certain value to avoid failures. Each of these integrated circuits 46 could be as small as 0.06 cm$^2$ and are attached to a copper tungsten flange 48 to facilitate the heat conduction and reduce thermal mismatch. The aspect ratio of the LDMOS integrated circuits 46 to the pallet 10 is rather large, creating a thermal spreading resistance. This resistance creates a temperature gradient throughout the pallet 10, which leads to under utilized thermal regions.

To address this thermal spreading resistance in a low cost, light weight structure, the pallet 10 is a hybrid structure comprising a solid metal support plate composed of a metal that is cost efficient and lightweight, such as aluminum, enhanced with one or more superior conductors (heat pipes 30) embedded in the support plate. Also, pallet 10 preferably has a modular shape adapted for flexibility in assembling different amplifier designs. The pallet 10 preferably has a flat top surface 20 and bottom surface 22 adapted for easy coupling to other structures and a generally rectangular modular shape. In the preferred embodiment the heat sink assembly 110 is coupled together by screws, bolts, rivets or like fasteners 26, and apertures or bores 28 are defined in the pallet 10 for receiving the fasteners 26 (as shown in FIG. 2).

Suitable heat pipes having the desired thermodynamic properties are commercially available which are then conformed to the desired modular pallet shape when they are embedded in the pallet as described below. In a suitable embodiment, illustrated best in FIG. 3 prior to being conformed to the pallet, the heat pipe 30 is a passive two-phase heat transfer device capable of transferring large quantities of heat with minimum temperature drop. It functions based on a closed two-phase cycle and utilizes the latent heat of vaporization to transfer heat with very small temperature gradient across its length. Heat pipe 30 is a sealed container lined with a wicking material. This container is evacuated and backfilled with just enough liquid to saturate the wick. In this case, it is charged with water due to its superior thermodynamics properties and proper operating temperature range for this application. The material of heat pipe 30 is preferably copper due to its high thermal conductivity coupled with the fact that contact with water does not cause corrosion. Heat pipe 30 comprises three regions, which are evaporator, condenser, and adiabatic regions. When heat is added to the evaporator region of the pipe, which is located under the heat dissipating regions, the working fluid in the wick is vaporized. The high pressure in this region causes the vapor to flow to the cooler region, where the vapor condenses, releasing its latent heat of vaporization. The capillary forces existing in the wicking structure then pump the liquid back to the evaporator. This system does not depend on gravitational acceleration for return of liquid from condenser to evaporator. Heat pipe 30 has an effective thermal conductivity, which is several orders of magnitude greater than the best solid conductors due to closed two-phase cycle mode of operation. It is understood that different types of wicks can be utilized in place of the sintered powder 34, which is utilized for this application to generate capillary forces that transport the working fluid 36 away from the heat source, depending on the application for which the heat pipe 30 is being used.

The number of heat pipes 30 incorporated into pallet 10 and their respective diameter is directly a function of the heat generation per electronics assembly and number of location of heat generating devices. As one example, for a pallet of about six inches long and about one quarter inches thick, suitable heat pipe dimensions may be about four inches of length and slightly less than one-quarter inches thick.

Figure 1:
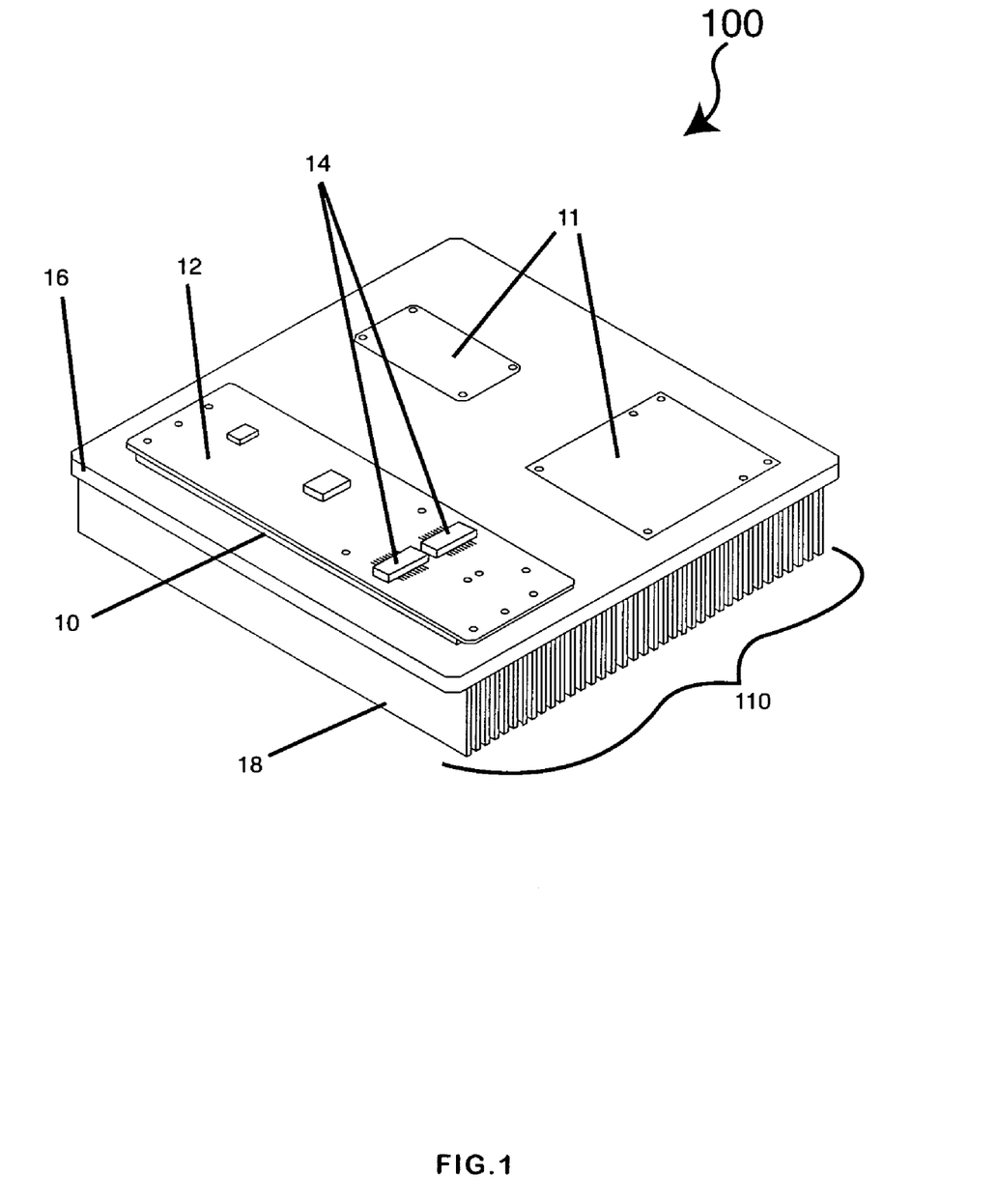
FIG. 1 shows an isometric view of a preferred embodiment of an RF power amplifier assembly in accordance with the present invention.
Figure 2:
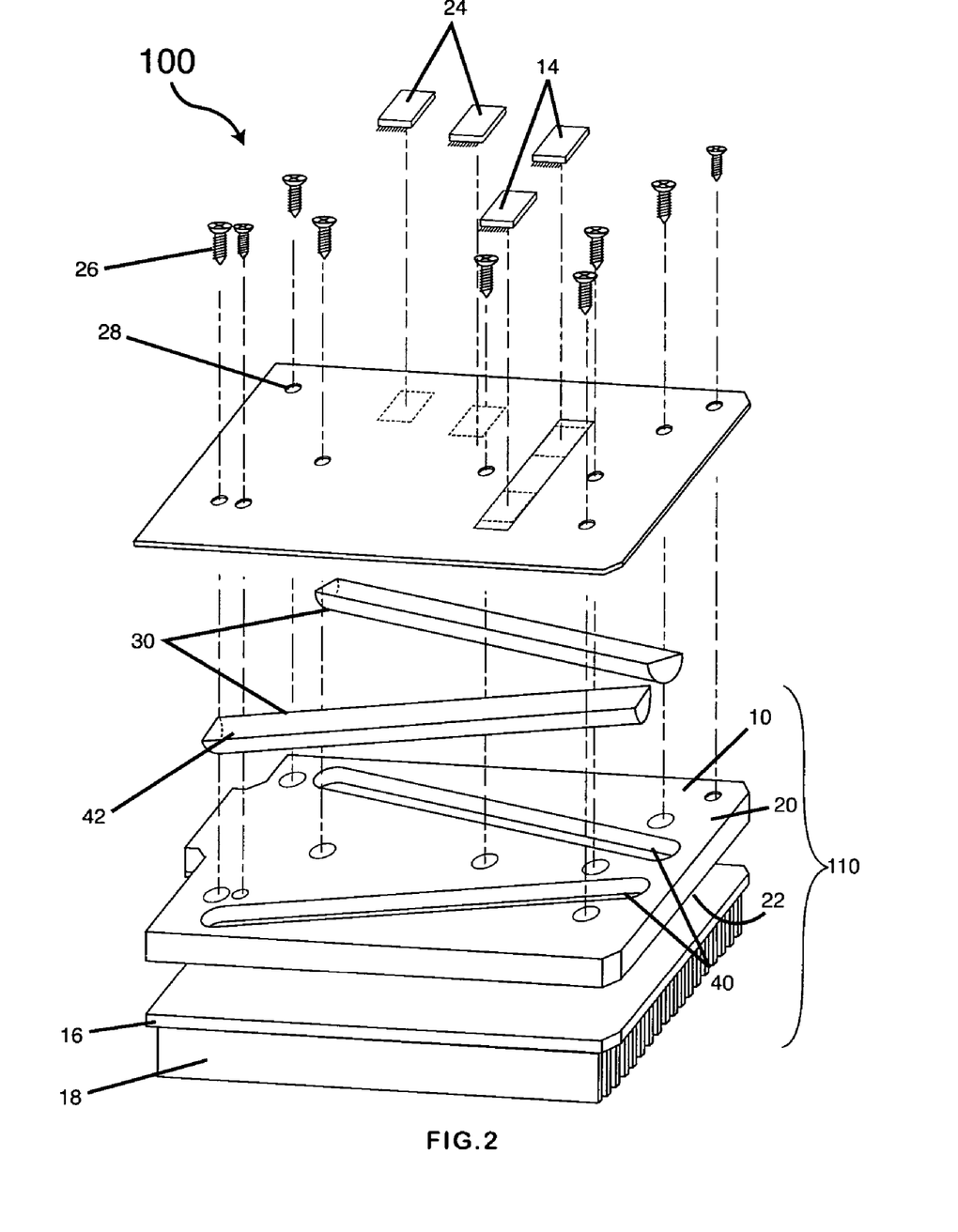
FIG. 2 shows an exploded view of a preferred embodiment of a heat sink assembly in accordance with the present invention.
Figure 3:
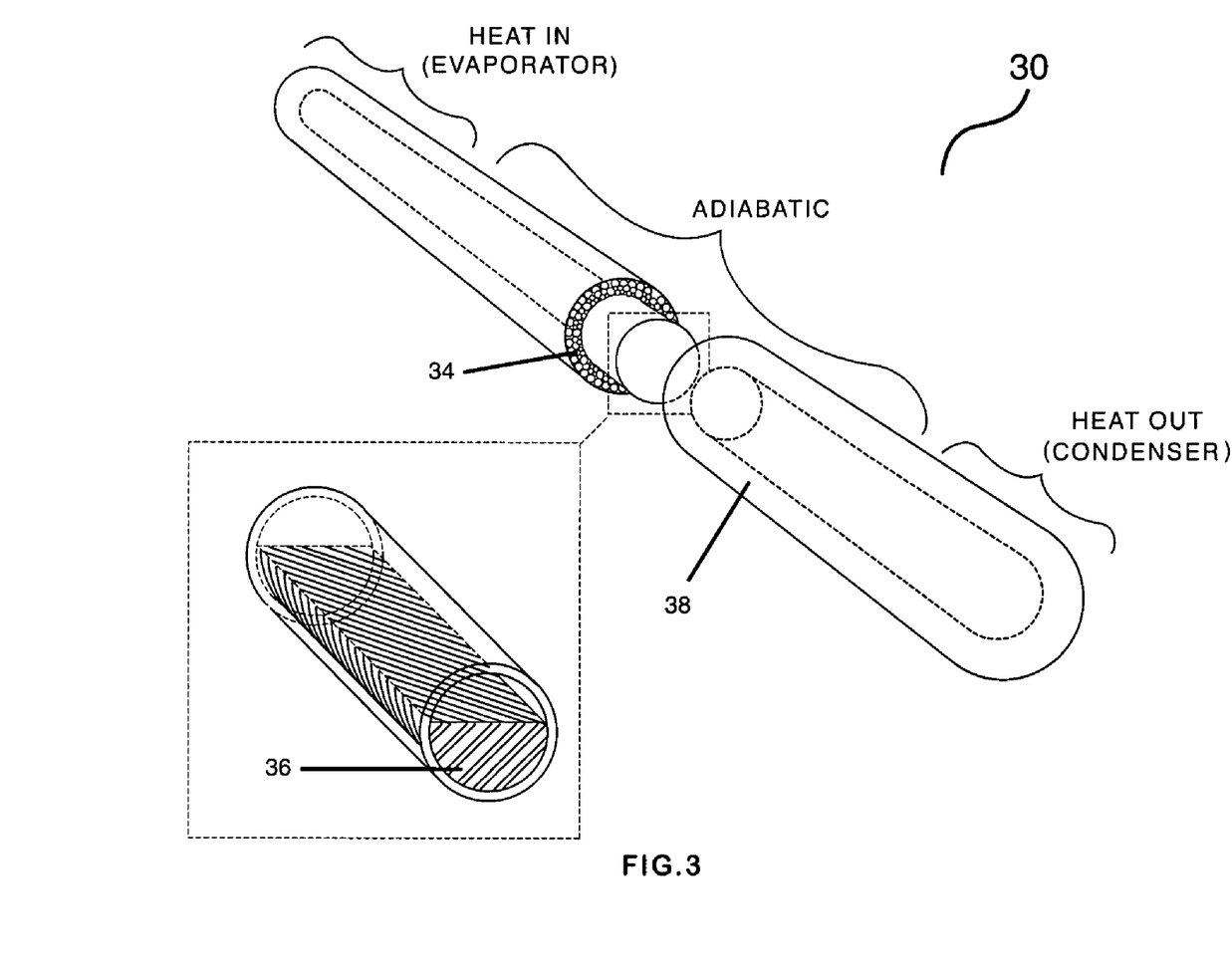
FIG. 3 shows isometric & cut away views of a heat pipe in accordance with the present invention.
Figure 4:
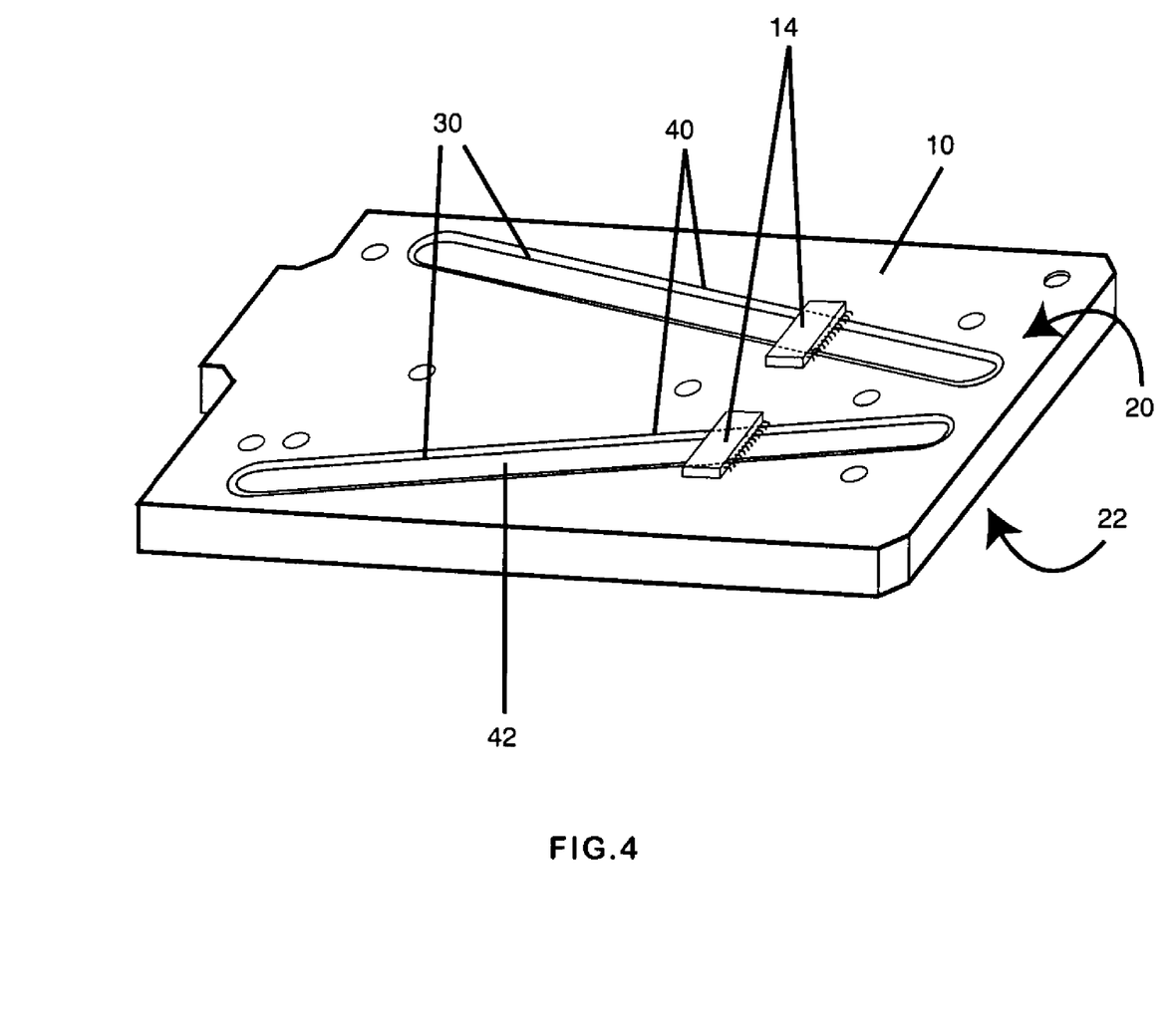
FIG. 4 shows an isometric view of a pallet in accordance with one embodiment of the present invention.
Figure 5:
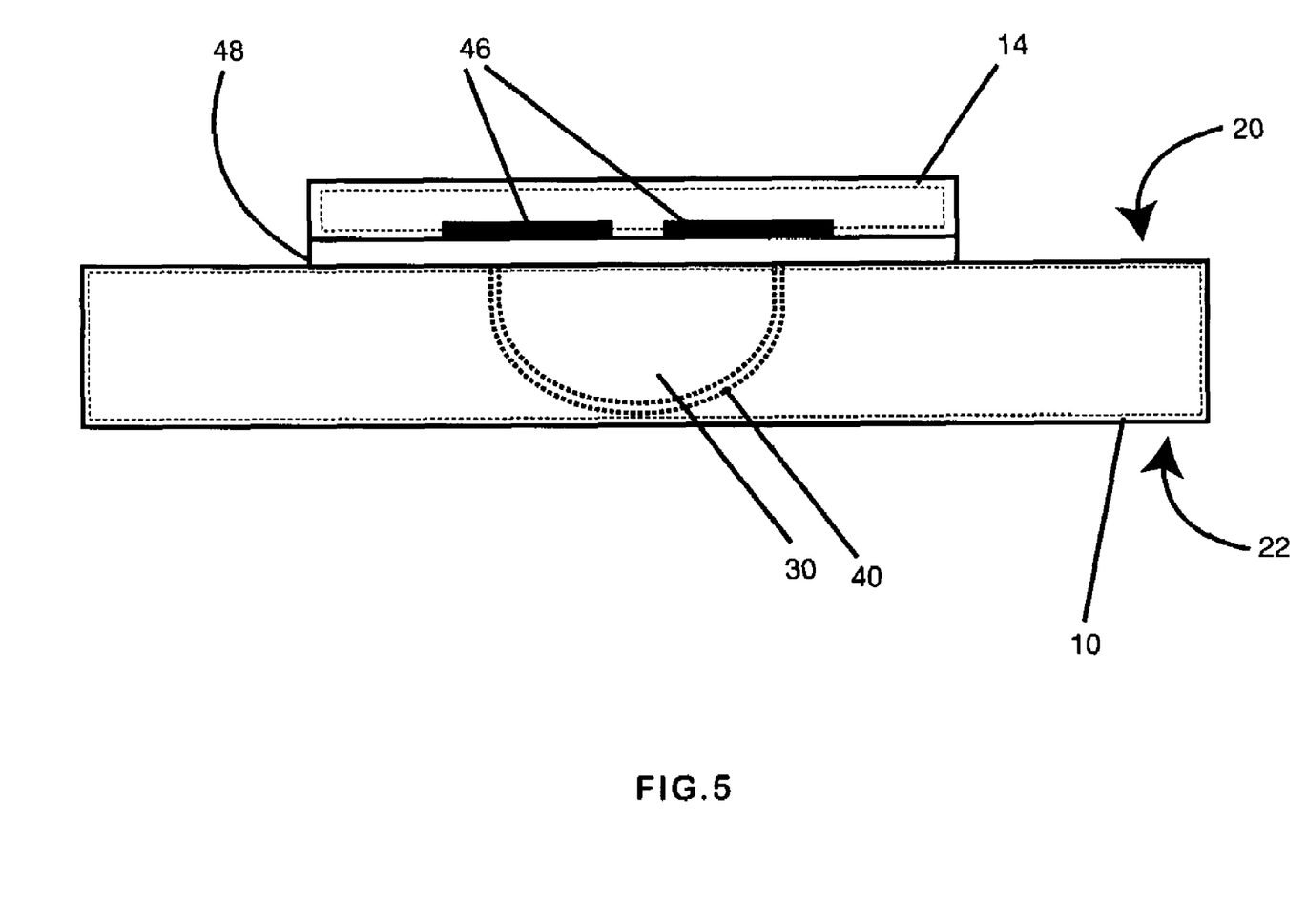
FIG. 5 shows a cut away view of a pallet in accordance with one embodiment of the present invention.

In a preferred embodiment, best illustrated in FIGS. 2, 4 and 5, the heat pipes 30 are integrated into the pallet 10 through channels 40 that are formed in the solid metal pallet 10 during casting or machined in afterward. The channels 40 that house the heat pipes 30 are preferably treated with thermally conductive epoxy, solder or other bonding material with good thermal conductivity. The heat pipes 30 are inserted into respective channels 40 and pressed in place and the bonding agent is cured. In order to prevent galvanic corrosion due to interface of dissimilar materials, the heat pipe is coated utilizing a variety of materials and processes. The heat pipe 30 may either be inserted from the top surface 20 or the bottom surface 22 of the pallet 10. In a preferred embodiment, the heat pipe 30 is machine pressed on the surface 20 or 22 where the pipes 30 were inserted. The surface may further be machined for greater regularity and flatness. The pipes 30 therefore comprise a flattened surface 42 that lays flush with the surface 20, 22 of the pallet 10 that the pipes 30 were inserted, assuring co-planarity between the pipe 30 and the pallet 10. For optimum transfer of heat in a preferred embodiment, the location of the heat pipes 30 are chosen to lie beneath the various heat generating devices 24, such as preamplifier circuits, and in particular power RF amplifier modules 14. The pallet 10 may then be mounted on the flat top surface of finned structure 16 in a conventional manner.

Figure 6:
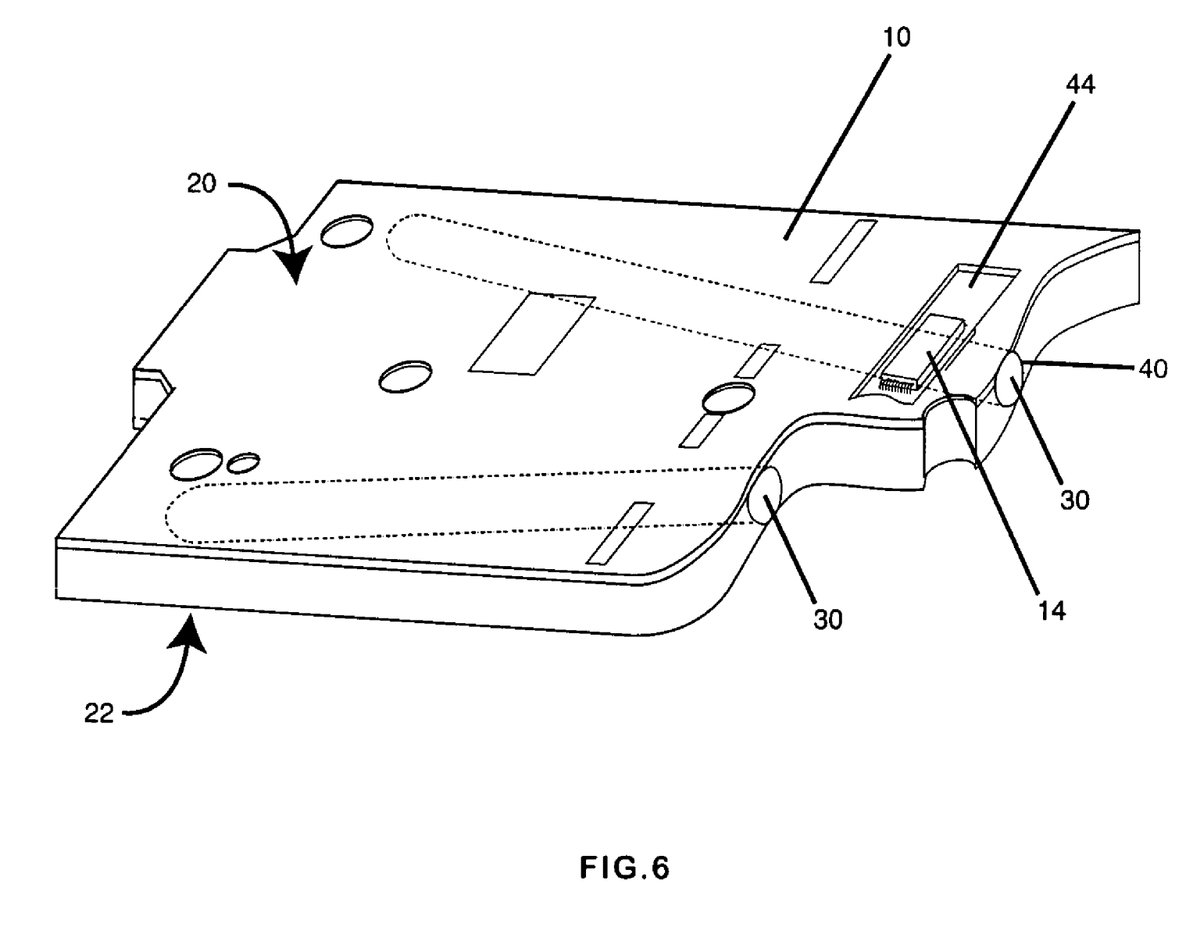
FIG. 6 shows an isometric view of an alternative embodiment of a pallet in accordance with the present invention.

As best shown in FIG. 6, if the heat pipe 30 is inserted through the bottom 22 of the pallet 10, a recess 44 is provided in the top surface of the pallet 10. The amplifier module 14 is inserted within the recess 44 and sits directly on top of the heat pipe 30.

Figure 7:
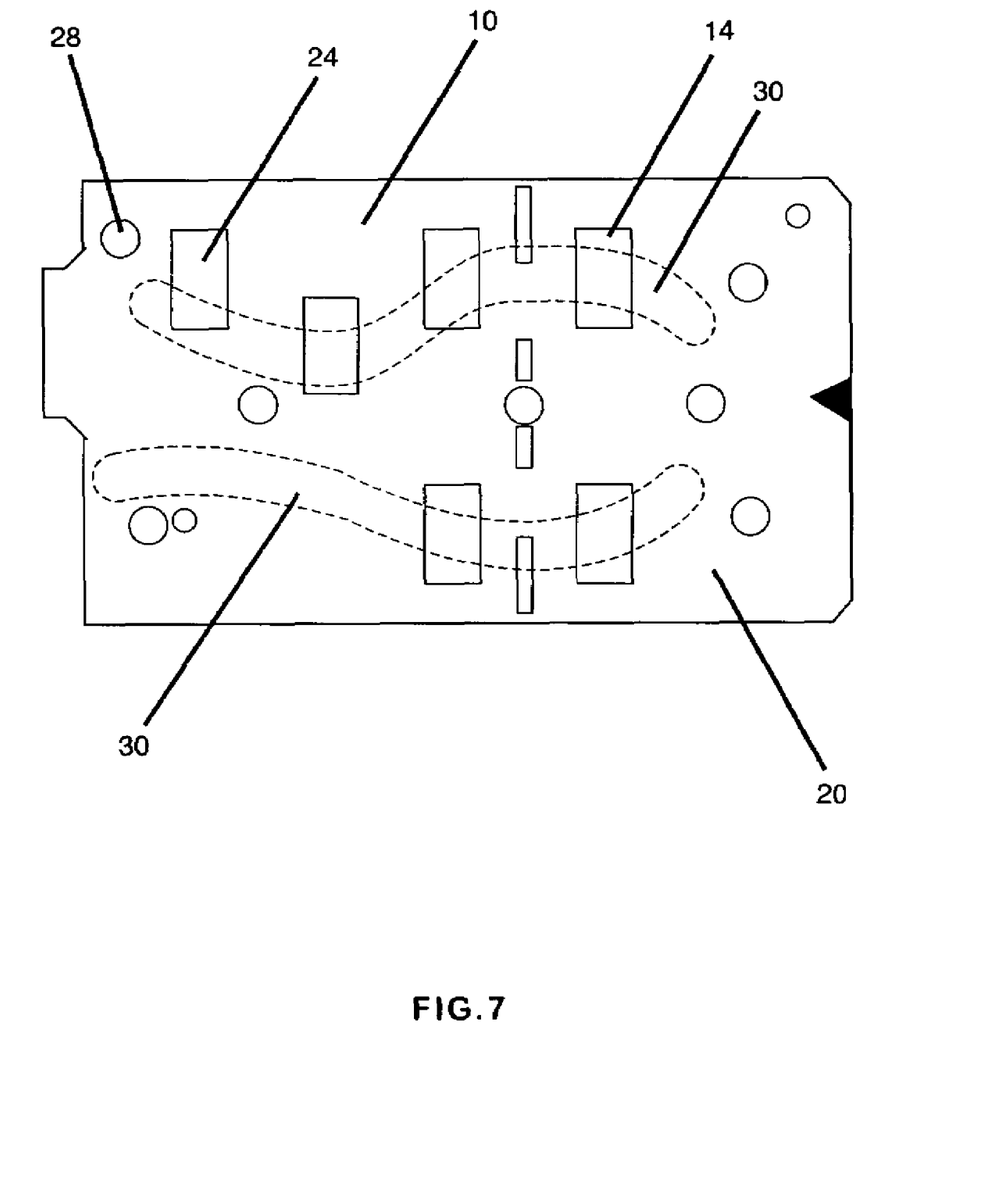
FIG. 7 shows a third embodiment of a pallet in accordance with the present invention.

In a preferred embodiment, plural heat pipes 30 pass below heat generating areas of the pallet, including the amplifier modules 14, and terminate in the under-utilized regions creating a more isothermal temperature distribution throughout the pallet. The heat pipes 30 may thus have a variable spacing along the length direction of the pallet as shown in FIGS. 2, 4 and 6 (i.e., the heat pipes are angled relative to each other) to spread heat from a localized region to a wider area of the pallet. In many cases one or more straight heat pipes 30 can provide the desired isothermalized distribution within the pallet 10. However, it should be understood that the heat pipes 30 can be in curved configurations, for example in the shape of an "S", as shown in FIG. 7.

Figure 8:
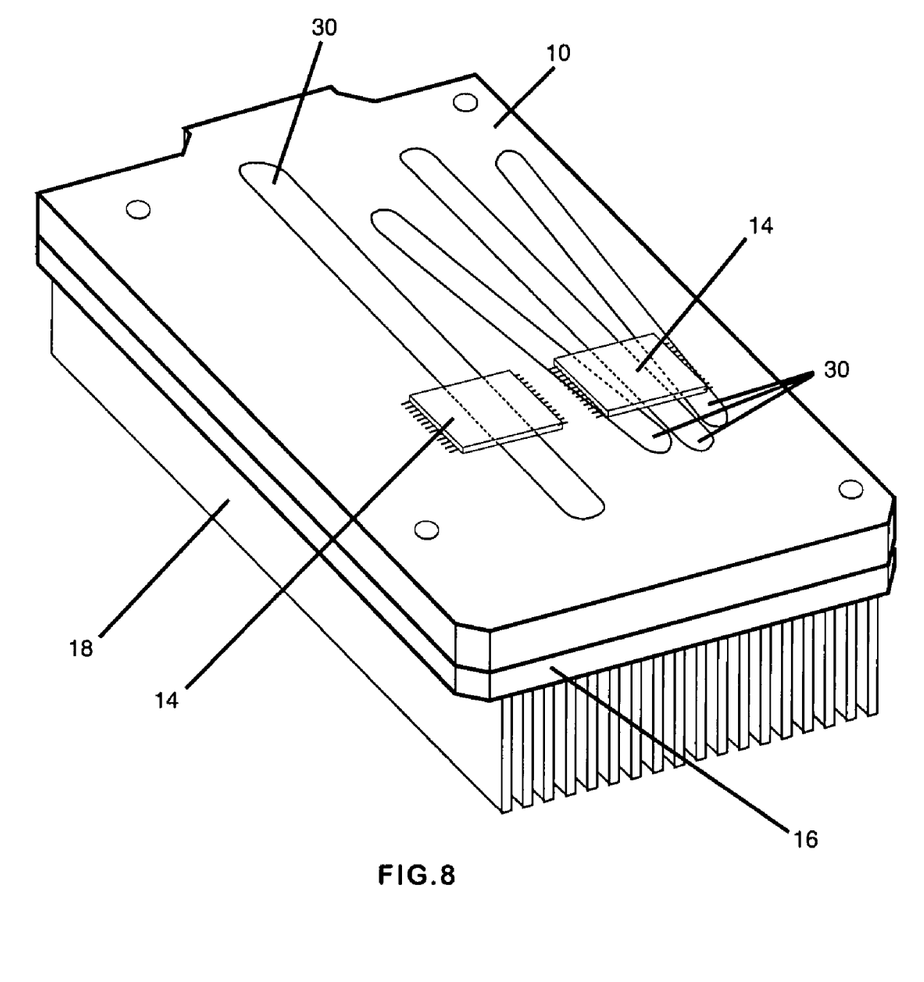
FIG. 8 shows a fourth embodiment of a power amplifier in accordance with the present invention.

As best seen in FIG. 8, the number of heat pipes 30 and their respective diameter is directly a function of the magnitude of heat generation per sources of heat. Depending on the configuration of the heat sink assembly 110 there could be more than one heat pipe for each individual amplifier module 14. For example, in a feed forward amplifier assembly or a Doherty amplifier assembly, there may be one amplifier module (main amplifier) which draws significantly more power than the other module (error or auxiliary amplifier, respectively) and plural heat pipes may be provided under the main amplifier module and only one under the other module to provide more even heat spreading over the pallet. For example, an amplifier design with a high power main amplifier and lower power auxiliary amplifier is disclosed in U.S. patent application Ser. No. 10/837,838 filed May 3, 2004, the disclosure of which is incorporated herein by reference. Thus, as one example illustrated in FIG. 8, three heat pipes are provided under a main amplifier module 14 and one under an auxiliary amplifier module 14.

The heat sink assembly 110 with the integrated heat pipes 30 yields equal or better thermal performance than a copper pallet, resulting in reduced maximum temperature observed in the pallet 10. More importantly, a significant reduction in both weight and cost is provided and the product is competitive with the copper pallet in terms of reliability. Also, the modular design of the heat sink assembly is compatible with a high degree of automated assembly and various thermal processing steps, such as solder reflow processing, of pallet 10 and circuit boards 12. This would not be possible if the heat pipes were simply mounted in the finned heat sink 16, and the pallets dispensed with, due to the large thermal mass of the finned heat sink. Also, higher levels of thermal efficiency are observed when the evaporator is as close as possible to the source of heat generation due to a less resistive path from source to evaporator. Specific examples of such pallet/circuit board thermal processing and assembly are described in U.S. Pat. No. 6,421,253, the disclosure of which is incorporated herein by reference and may be employed for pallet 10 and circuit boards 12.

Many alterations and modifications may be made by those having ordinary skill in the art without departing from the spirit and scope of the invention. For example, it should be appreciated that the specific illustrations of the electronics assembly shown in FIGS. 1-8, as well as the illustrations of components thereof and alternate embodiments, is provided for convenience of illustration and explanation rather than accuracy of layout, etc. For example, the various elements are not shown to scale or necessarily in optimal configuration.

Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

What is claimed is:

1. A power amplifier assembly, comprising:
   at least one electronics module including an RF power amplifier circuit;
   a pallet comprised of a support plate enhanced with plural heat pipes having substantially higher thermal conductivity than the support plate embedded in the support plate; and
   a separate finned heat sink;
   wherein the electronics module is mounted on the pallet and the pallet is mounted on the finned heat sink;
   wherein the support plate is a generally rectangular shaped solid metal plate and includes one or more hollow channels that transverse a horizontal surface of the plate, and the heat pipes are mounted in said one or more channels; and
   wherein the heat pipes have varying spacing along the length direction of the support plate.

2. A power amplifier assembly as set out in claim 1, wherein the heat pipes each comprise a vacuumed hollow tube having a porous inner space containing a working fluid.

3. A power amplifier assembly as set out in claim 2, wherein the support plate is composed of a first material having a first thermal conductivity, and the heat pipes each comprise a superior conductor having an effective thermal conductivity several orders of magnitude higher than the first thermal conductivity.

4. A power amplifier assembly as set out in claim 3, wherein the support plate is composed of aluminum and the heat pipes are each comprised of a copper tube, a wicking structure or material, and a working fluid.

5. A power amplifier assembly as set out in claim 1, wherein the finned heat sink is composed of aluminum.

6. A power amplifier assembly as set out in claim 1, wherein the heat pipes have a generally cylindrical shape flattened on one surface portion to be coplanar with the surface of the support plate.

7. A power amplifier assembly as set out in claim 6, wherein the heat pipes are curved along the length direction of the cylinder.

8. A power amplifier assembly as set out in claim 2, wherein the RF power amplifier circuit comprises plural amplifier device modules and wherein each of the heat pipes are configured below each of the said modules.

9. A power amplifier assembly, comprising:
   at least one electronics module including an RF power amplifier circuit;
   a pallet comprised of a support plate enhanced with one or more heat pipes having substantially higher thermal conductivity than the support plate embedded in the support plate; and
   a separate finned heat sink;
   wherein the electronics module is mounted on the pallet and the pallet is mounted on the finned heat sink;
   wherein the support plate is a generally rectangular shaped solid metal plate and includes one or more hollow channels that transverse a horizontal surface of the plate, and the one or more heat pipes are mounted in said one or more channels;
   wherein the one or more heat pipes have a generally cylindrical shape flattened on one surface portion; and
   wherein the one or more heat pipes are inserted into the one or more channels through the top surface of the pallet and the flattened portion of the one or more heat pipes being coplanar with the top surface of the support plate.

10. A power amplifier assembly, comprising:
    at least one electronics module including an RF power amplifier circuit;
    a pallet comprised of a support plate enhanced with one or more heat pipes having substantially higher thermal conductivity than the support plate embedded in the support plate; and
    a separate finned heat sink;
    wherein the electronics module is mounted on the pallet and the pallet is mounted on the finned heat sink;
    wherein the support plate is a generally rectangular shaped solid metal plate and includes one or more hollow channels that transverse a horizontal surface of the plate, and the one or more heat pipes are mounted in said one or more channels;
    wherein the one or more heat pipes have a generally cylindrical shape flattened on one surface portion to be coplanar with the surface of the support plate; and
    wherein the one or more heat pipes are inserted into the one or more channels through a bottom surface of the pallet and the support plate has an opening in the top surface extending down to the heat pipes.

11. A power amplifier assembly, comprising:
    at least one electronics module including an RF power amplifier circuit;
    a pallet comprised of a support plate enhanced with plural heat pipes having substantially higher thermal conductivity than the support plate embedded in the support plate; and
    a separate finned heat sink;
    wherein the electronics module is mounted on the pallet and the pallet is mounted on the finned heat sink;
    wherein each of the heat pipes comprise a vacuumed hollow tube having a porous inner space containing a working fluid;
    wherein the RF power amplifier circuit comprises a main amplifier device module and a lower power auxiliary amplifier device module and wherein each of the heat pipes are configured below said main module.

12. A modular heat pipe enhanced heat sink assembly, comprising;
    a finned heat sink having a generally flat upper surface;
    a generally rectangular support plate; and
    a plurality of heat pipes mounted within the support plate, wherein the heat pipes are angled relative to each other having a spacing which varies along their length direction;
    wherein the support plate is mounted onto the flat surface of the finned heat sink.

13. A modular heat pipe enhanced heat sink assembly as set out in claim 12, wherein the heat pipe's interior wall is lined with a porous material and filled with a working fluid.

14. A modular heat pipe enhanced heat sink assembly as set out in claim 12, wherein the support plate comprises at least one channel that transverses through the plate to a horizontal surface of the plate, wherein the channel receives at least one of the heat pipes and wherein the at least one heat pipe lies flush with the horizontal surface of the pallet.

15. A modular heat pipe enhanced heat sink assembly as set out in claim 12, wherein the support plate comprises a first material having a first thermal conductivity; and each heat pipe is a superior conductor having an effective thermal conductivity several order of magnitude higher than the first thermal conductivity.

16. A modular heat pipe enhanced heat sink assembly as set out in claim 15, wherein the finned heat sink is composed of aluminum, the support plate is composed of aluminum and each heat pipe is comprised of a copper tube, a wicking structure or material, and a working fluid.

* * * * *